(12) United States Patent
Tabuchi

(10) Patent No.: US 6,443,315 B1
(45) Date of Patent: Sep. 3, 2002

(54) INSERTION AND REMOVAL SYSTEM IN PLUG-IN UNIT

(75) Inventor: Hiroshi Tabuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/774,724

(22) Filed: Feb. 1, 2001

(30) Foreign Application Priority Data

Jul. 28, 2000 (JP) ........................................ 2000-229668

(51) Int. Cl.$^7$ ................................................ H05K 7/14
(52) U.S. Cl. ........................ 211/41.17; 211/26; 361/740; 361/747
(58) Field of Search ................................. 211/41.17, 26; 361/740, 747, 759, 798

(56) References Cited

U.S. PATENT DOCUMENTS

| | | | | |
|---|---|---|---|---|
| 4,648,009 A | * | 3/1987 | Beun et al. | |
| 4,740,164 A | * | 4/1988 | Schulz et al. | |
| 4,996,631 A | * | 2/1991 | Freehauf | |
| 4,999,744 A | * | 3/1991 | Blankenship | |
| 5,140,501 A | * | 8/1992 | Takahashi et al. | |
| 5,216,518 A | * | 6/1993 | Zenitani et al. | |
| 5,293,303 A | * | 3/1994 | Fletcher et al. | 361/798 |
| 5,317,482 A | * | 5/1994 | Bujtas | 361/798 |

FOREIGN PATENT DOCUMENTS

| | | |
|---|---|---|
| JP | 4-188794 | 7/1992 |
| JP | 4-99590 | 8/1992 |
| JP | 6-21291 | 3/1994 |
| JP | 6-21273 | 6/1994 |
| JP | 7-22587 | 4/1995 |
| JP | 2000-91770 | 3/2000 |

* cited by examiner

*Primary Examiner*—Robert W. Gibson, Jr.
(74) *Attorney, Agent, or Firm*—Oblon, Spivak, McClelland, Maier & Neustadt, P.C.

(57) ABSTRACT

An insertion and removal system in a plug-in unit includes a handle-extension slide element inserted freely into the lever part in an advanced or retracted direction to slide in a longitudinal direction of the lever part between an extension position extended from a length of the lever part at the maximum and a retracted position substantially corresponding to the length of the lever part and a locking element arranged on the handle-extension slide element and the front panel, the locking element for locking the handle-extension slide element being slidable to the retracted position on the front panel.

13 Claims, 12 Drawing Sheets

INSERTION AND REMOVAL SYSTEM IN PLUG-IN UNIT

BACKGROUND OF THE INVENTION

1. Field of the Invention

The present invention relates to a plug-in unit consisting of a sub-rack constituting electronic equipment such as communication equipment and related structure and a printed circuit board including electronic circuit parts inserted into and removed from the sub-rack. for inserting the plug-in unit into the sub-rack and removing the plug-in unit from the sub-rack.

2. Description of the Prior Art

FIG. 1 is a perspective view of the constitution of a conventional sub-rack. In FIG. 1, reference numeral 100 denotes a sub-rack while 101 denotes a top plate, 102 denotes a bottom plate, 103 denotes a side plate and 104 denotes a front rail arranged on front edges of the top plate 101 and the bottom plate 102, respectively. Reference number 105 denotes a mid-rail arranged on a midrange of the top plate 101 and the bottom plate 102, respectively, so as to cross the midrange while 106 denotes a guide rail whose opposite ends are mounted on upper faces of the front rail 104 and the mid-rail 105 and 107 denotes a locating hole used for locating a position on which a plug-in unit (not shown) is inserted.

FIG. 2 is a perspective view of the sub-rack 100 that a plug-in unit is partially mounted. In FIG. 2, 111 denotes a front panel for covering an opening of the sub-rack 100 when the plug-in unit is housed in the sub-rack 100 while 112 denotes a handle arranged on the front panel 111, the handle 112 being used for insertion and removal of the plug-in unit. Reference number 112a denotes a lever part being operated on operating rotationally the handle 112. FIG. 3 is a side view of the constitution of a plug-in unit inserted into the sub-rack. In FIG. 3, reference number 120 denotes a plug-in unit, 121 denotes a printed circuit board constituting the plug-in unit, and 122 denotes a connector arranged on the printed circuit board 121, which can be connected to a connector arranged on a back plane by a plug-in mode. Reference number 123 denotes a guide pin, which is inserted into a locating hole 107 in order to locate the front panel 111, 124 denotes a handle-support part, which is coupled to the printed circuit board 121 or the front panel 111 and 125 denotes a pin, which is locked to the handle 112 or the handle-support part 124 to allow the rotation of the handle 112 with respect to the handle-support part 124. In FIG. 3, since common numerals denote common elements in FIG. 2, the description of such parts is omitted.

FIG. 4 is a side view of a conventional insertion and removal system in a plug-in unit for inserting the plug-in unit into the sub-rack and removing the plug-in unit from the sub-rack. In FIG. 4, reference number 131 denotes a first engagement claw formed on the handle 112 and 132 denotes a second engagement claw formed on the handle 112. Reference number 133 denotes a first engagement part formed on the front rail 104 and 134 denotes a second engagement part formed on the front rail 104. In FIG. 4, since the common numerals denote common elements in FIGS. 1 to 3, the description of such parts is omitted.

The motion will be described as follows:

When the plug-in unit 120 having the printed circuit board 121 is inserted into the sub-rack 100, the printed circuit board 121 is slid along a groove formed on the guide rail 106. The guide pin 123, arranged on the plug-in unit 120, is then inserted into the locating hole 107 formed in the front rail 104 to locate the front panel 111 with respect to the front rail 104. The lever part 112a of the handle 112 is then rotated in a direction of arrow A shown in FIG. 4 in a state of engaging the first engagement claw 131 of the handle 112 with the first engagement part 133 of the front rail 104. The connector 122 of the printed circuit board 121 is connected to the back plane to finish the insertion of the plug-in unit 120.

When the plug-in unit 120 is removed from the sub-rack 100, the lever part 112a of the handle 112 is rotated in a direction of arrow B shown in FIG. 4 in a state of engaging the second engagement claw 132 of the handle 112 with the second engagement part 134 of the front rail 104 to disconnect the connector 122 of the printed circuit board 121 from the back plane. The printed circuit board 121 is pulled along the groove formed on the guide rail 106 to remove the plug-in unit 120 from the sub-rack 100.

With such an arrangement of the insertion and removal system in the plug-in unit, the length of the lever part 112a of the handle 112 cannot be changed. Consequently, it is not possible to provide a sufficient force for insertion and removal according to the plug-in unit with the necessary insertion and removal force, as the trend toward more and more pins on a connector.

In the case that the lever part 112a of the handle 112 is increased in length to be compatible with the plug-in unit with the need of the insertion and removal force, an area mounted on the front panel 111 is narrowed because of the long lever part 112a.

In the case that the lever part 112a of the handle 112 is carelessly rotated in the direction of arrow B shown in FIG. 4 in a state of fitting the plug-in unit 120 in the sub-rack 100, there is a possibility that the plug-in unit 120 is accidentally removed from the sub-rack 100.

JP-A-2000/91770 discloses an insertion and removal system in a plug-in unit for resolving such problems above.

FIG. 5 is a side view of the constitution of a conventional insertion and removal system (hereafter, referring to a conventional example 1) in a plug-in unit as disclosed in JPA-2000/91770. In FIG. 5, 221 denotes a tool for insertion and removal system in a plug-in unit. Reference number 222 denotes a lever part rotationally operated on insertion and removal of the plug-in unit with respect to the sub-rack and 222A denotes a slider constituting the lever 222, which is inserted into a tubular part 223A of a main body 223. Reference number 222B denotes an action part for insertion and removal of the lever 222, which is acted upon by a rotational force when rotationally operating. Reference number 223 denotes a main body having a tubular part 223A which allows insertion of the slider 222A of the lever 222 while 223AA denotes a first engagement part arranged on the main body 223, and 223BA denotes a second engagement part arranged on the main body 223. Reference number 228 denotes a central hole which allows insertion of a pin 241 for rotating a construction part, including the lever 222 and the main body 223, in an insertion or removal direction. Reference number 231 denotes a printed circuit board constituting the plug-in unit and 233 denotes a vertical piece formed on a portion, on which the tool 221 is placed, at a right angle.

Operation of this invention will be explained as follows when the plug-in unit having the printed circuit board 231 is inserted into the sub-rack, the printed circuit board 231 is slid in the direction of arrow 251 along a groove formed on the guide rail. The slider 222A is slid from the tubular part 223A of the main body 223 in an extension direction of the length of the lever 222. The action part 222B of the lever 222 in the tool 221 is rotated in a direction of arrow 252 about a rotational axis including the central hole 228 and the pin 241. Here, the second engagement part 223BA of the main body 223 is engaged with the vertical piece 233 of the sub-rack to transfer such a rotational force as a force in a direction of arrow 251 to the printed circuit board 231. As a result, the printed circuit board 231 of the plug-in unit is moved in the direction of arrow 251 to insert the plug-in unit into the sub-rack.

When the slider 222A is downwardly slid in a state of rotationally moving the lever 222 toward the printed circuit board 231, the slider 222A is ejected from a lower end of the tubular part 223A. The ejected slider 222A comes into contact with one side of the vertical piece 233 having the other opposite side where the printed circuit board 231 is arranged. As a result, the rotation of the tool 221 is locked. Up to this point, the insertion motion of the plug-in unit is finished.

When the plug-in unit is removed from the sub-rack, the slider 222A is slid from the tubular part 223A of the main body 223 in an extension direction of the length of the lever 222. The action part 222B of the lever 222 in the tool 221 is rotated in a direction of arrow 253 about a rotational axis including the central hole 228 and the pin 241. Here, the first engagement part 223AA of the main body 223 is engaged with the vertical piece 233 of the sub-rack to transfer such a rotational force as a force in a direction of arrow 254 to the printed circuit board 231. As a result, the printed circuit board 231 of the plug-in unit is moved in the direction of arrow 254 to remove the plug-in unit from the sub-rack.

Thus, the length of the lever part can be changed by sliding the slider 222A in the tubular part 223A of the main body 223. Consequently, a sufficient force for insertion and removal according to the plug-in unit can be provided, as the trend toward more and more pins on a connector continues. The area, mounted on the front panel, is not narrowed because the lever 222 is changeable in length.

Another system is disclosed in JP-U-6/21273. FIG. 6 is a side view of the constitution of a conventional insertion and removal system (hereafter, referring to a conventional example 2) in a plug-in unit as disclosed in JP-U-6/21273. In FIG. 6, reference number 302 denotes an extension lever part of engaging with an operation part 321a of a lever 321 to substantially extend the length of the lever 321 while 303 denotes a mounting part for mounting the lever 321 on a lower portion of a front end of the printed circuit board 310. Reference number 303b denotes a rotational axis for rotating the lever 321 in an insertion or removal direction of the plug-in unit while 304 denotes a first engagement claw arranged on the mounting part 303 and 305 denotes a second engagement claw arranged on the mounting part 303. Reference number 310 denotes a printed circuit board constituting the plug-in unit while 311 denotes a front rail arranged on a front end of the sub-rack, and 311a denotes an engagement part arranged on the front rail 311. Reference number 321 denotes a lever part including the mounting part 303, the operation part 321a and the extension lever 302 while 321a denotes the operation part used for inserting freely the extension lever 302 in an advance or retreat direction.

The operation of this invention will be described as follows:

When the plug-in unit having the printed circuit board 310 is inserted into the sub-rack, the printed circuit board 310 is slid along a groove formed on the guide rail. The extension lever 302 is slid on the operation part 321a in an extension direction of the length of the lever 321 to rotate the extension lever 302 in an insertion direction of the plug-in unit about the rotational axis 303b. Here, the first engagement part 304 of the mounting part 303 is engaged with the engagement part 311a of the front rail 311 to transfer such a rotational force as a force in the insertion direction to the printed circuit board 310. As a result, the printed circuit board 310 is moved in the insertion direction of the plug-in unit to be inserted into the sub-rack.

The extension lever 302 is then slid on the operation part 321a in an opposite direction of arrow B shown in FIG. 6. An end of the extension lever 302 on the side of the printed circuit board 310 is moved to inside of a circle having a radius, which is defined by a length R between the mounting part 303 and a corner of the printed circuit board 310. As a result, the end of the extension lever 302 on the side of the printed circuit board 310 comes into contact with the mounting part 303 and the corner of the printed circuit board 310. Rotation of the lever 321 is thus prevented. Up to this point, the insertion motion of the plug-in unit is finished.

When the plug-in unit is removed from the sub-rack, the extension lever 302 is slid on the operation part 321a in the extension direction of the length of the lever 321 to rotate the extension lever 302 in a removal direction of the plug-in unit about the rotational axis 303b. Here, the second engagement part 305 of the mounting part 303 is engaged with the engagement part 311a of the front rail 311 to transfer such a rotational force as a force in the removal direction to the printed circuit board 310. As a result, the printed circuit board 310 is moved in the removal direction of the plug-in unit to be removed from the sub-rack.

With such an arrangement, the conventional example 2 can obtain the same effects as the conventional example 1. With the conventional example 2, the rotation of the lever 321 is locked when the extension lever 302 is pushed down to a shrinkage position to prevent the plug-in unit from accidental removal out of the sub-rack.

With the conventional example 1, the slider 222A is ejected from the lower end of the tubular part 223A, and the ejected slider 222A comes into contact with one side of the vertical piece 233 having the other opposite side where the printed circuit board 231 is arranged. As a result, rotation of the tool 221 is prevented. A locking system must be therefore arranged beneath a rotational fulcrum of the tool 221, and the insertion and removal system on the periphery of an opening of the sub-rack is unavoidably increased in size to limit a downsizing of such system.

With the conventional example 2, the end of the extension lever 302 on the side of the printed circuit board 310 is moved to inside of a circle having a radius defined by the length R between the mounting part 303 and a corner of the printed circuit board 310. Accordingly, rotation of the lever 321 is prevented. As a result, the contact part of the extension lever 302 with the printed circuit board 310 must be arranged to be close to the rotational axis 303b in principle. When an external force is slightly acted on the lever part 302 on locking, a large force is acted on the contact part to facilitate breakage of the contact part.

If high-accuracy finish of an end face of the printed circuit board 310 and high-relative positional accuracy of the printed circuit board 310 to the rotational axis 303b are obtained, locking functions cannot be performed.

SUMMARY OF THE INVENTION

Accordingly, it is an object of the present invention to provide an insertion and removal system in a plug-in unit as follows:

The system includes a lever part substantially changeable in length so as to provide a sufficient insertion and removal force according to the plug-in unit with the need of the insertion and removal force.

The system includes a lever part, which can be shrunk after placing the plug-in unit in the sub-rack to prevent an area mounted on a front panel from narrowing.

The system does not allow breakage thereof on which external forces are exerted.

The system does not require high accuracy for manufacture of the plug-in unit.

The system includes a locking system, which does not limit to scale down it.

In order to achieve the object of the present invention, an insertion and removal system in a plug-in unit comprises a front panel arranged on a plug-in unit inserted into a sub-rack, the front panel covering an opening frame of the sub-rack when the plug-in unit is inserted into the sub-rack; a handle element including a lever part rotationally supported on an end of the front panel and rotationally operated in a direction of insertion or removal of the plug-in unit with respect to the sub-rack, and an engagement part engaging with a projection arranged on the opening frame of the sub-rack to transfer a rotational force worked on rotationally operating the lever part to the projection, as a force for acting in the insertion or removal direction; a handle-extension slide element inserted freely into the lever part in an advance or retreat direction to be slid in a longitudinal direction of the lever between an extension position of the lever on extending the lever at the maximum and a shrinkage or retracted position of the lever whose length nearly corresponds to the length of the lever; and a locking element arranged on the handle-extension slide element and the front panel, the locking element for locking the handle-extension slide element being slidable to the shrinkage or retracted position on the front panel.

Here, the locking element may include a pit arranged in the handle-extension slide element and a projection arranged on the front panel for mating with the pit, and the handle-extension slide element maybe locked by mating the projection with the pit when the handle-extension slide element is slid to the shrinkage position.

The handle-extension slide element may have a pit arranged in the front panel. A detector may further include a detector for detecting an insertion or removal state of the plug-in unit with respect to the sub-rack, with linking to a locking motion and an unlocking motion of the locking element with respect to the handle-extension slide element or the lever element.

An insertion and removal system in plug-in unit comprises a front panel arranged on a plug-in unit inserted into a sub-rack, the front panel for covering an opening frame of the sub-rack when the plug-in unit is inserted into the sub-rack; a handle element including a lever part rotationally supported on an end of the front panel and rotationally operated in a direction of insertion or removal of the plug-in unit with respect to the sub-rack, and an engagement part engaging with a projection arranged on the opening frame of the sub-rack to transfer a rotational force worked on rotationally operating the lever part to the projection, as a force in the insertion or removal direction; a handle-extension slide element inserted freely into the lever part in an advance or retreat direction to be slid in a longitudinal direction of the lever between an extension position of the lever on extending the lever at the maximum and a shrinkage position of the lever part whose length nearly corresponds to the length of the lever part; and a locking element including an engagement pit arranged in the lever part and an engagement projection arranged on the front panel, the engagement projection engaging with the engagement pit when the lever part is rotated toward the front panel side, for locking the lever part on the front panel by transferring a stress generated in the lever part to the engagement pit as a force narrowing an opening diameter of the engagement pit to lock the lever part on the front panel.

Here, a detector may be arranged on an outer peripheral portion of the engagement projection, the detector detecting a normal finish of the engagement motion with respect to the engagement pit.

The handle-extension slide element may have a pit arranged in the front panel.

The detector may further comprise a detector for detecting an insertion or removal state of the plug-in unit with respect to the sub-rack, with linking to a locking motion and an unlocking motion of the locking element with respect to the handle-extension slide element or the lever part.

An insertion and removal system in plug-in unit comprises a front panel arranged on a plug-in unit inserted into a sub-rack, the front panel for covering an opening frame of the sub-rack when the plug-in unit is inserted into the sub-rack; a handle element including a lever part rotationally supported on an end of the front panel and rotationally operated in a direction of insertion or removal of the plug-in unit with respect to the sub-rack, and an engagement part engaging with a projection arranged on the opening frame of the sub-rack to transfer a rotational force worked on rotationally operating the lever part to the projection, as a force in the insertion or removal direction; a handle-extension rotation element rotationally supported on the lever part to rotationally move in a longitudinal direction of the lever part between an extension position of the lever part on extending the lever part at the maximum and a refractive position of the lever part whose length nearly corresponds to the length of the lever part; and a locking element arranged on the handle-extension rotation element and the front panel, the locking element for locking the handle-extension rotation element, rotationally moved to the refractive position, on the front panel.

Here, the handle-extension rotation element may include an axial part rotationally supported on the lever part and a plate part of connecting with the axial part, the handle-extension rotation element in the extension position has a planar shape.

The locking element may include a projection, which is arranged in the handle-extension rotation element, and a pit, which is arranged in the front panel for mating with the projection, and wherein the handle-extension rotation element is locked by mating the projection with the pit when the handle-extension rotation element is rotationally moved to the refractive position.

The handle-extension rotation element may include an axial part rotationally supported by the lever part and a plate part of connecting with the axial part, the handle-extension rotation element in the extension position has a planar shape.

The detector may further comprise a detector for detecting an insertion or removal state of the plug-in unit with respect to the sub-rack, with linking to a locking motion and an unlocking motion of the locking element with respect to the handle-extension rotation element.

DESCRIPTION OF THE PREFERRED EMBODIMENTS

One embodiment according to the present invention will be described as follows:

Embodiment 1

Figure 1:
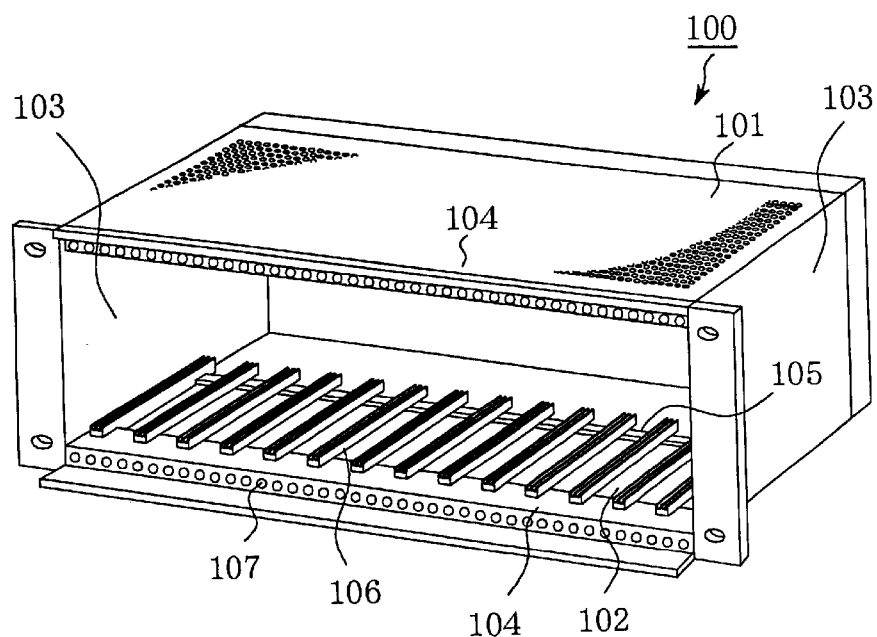
FIG. 1 is a perspective view of a conventional sub-rack.
Figure 2:
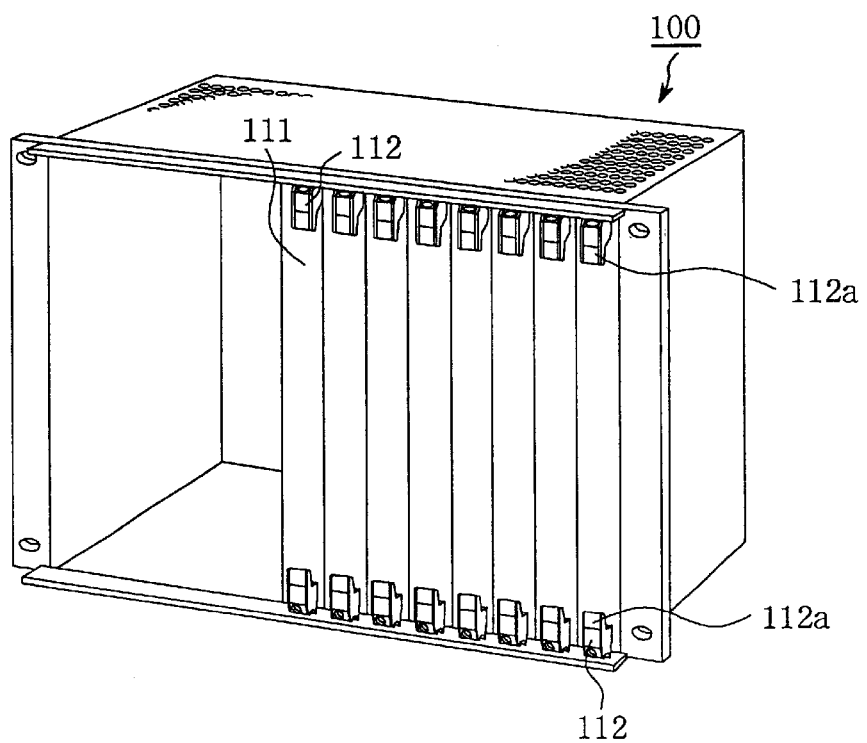
FIG. 2 is a perspective view of the sub-rack 100 that a plug-in unit is partially mounted.
Figure 3:
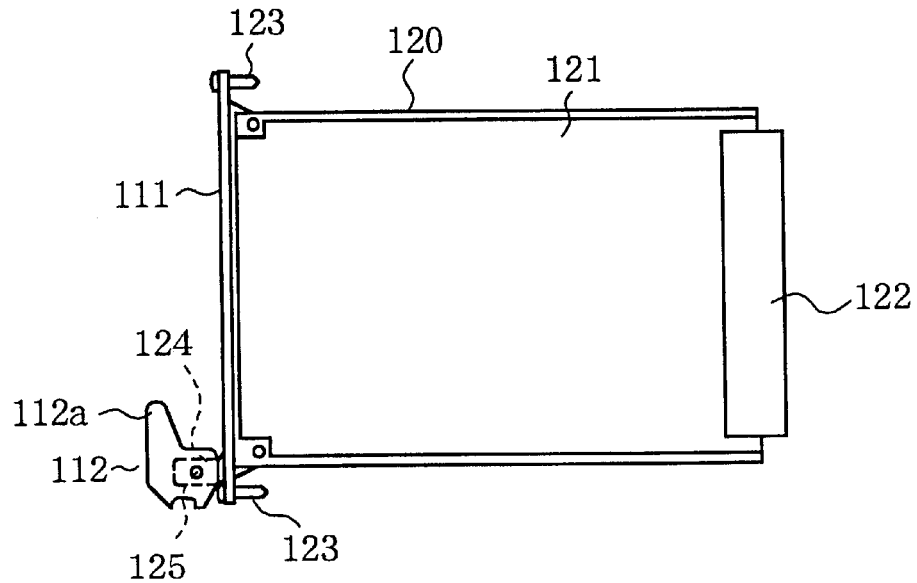
FIG. 3 is a side view of the constitution of a plug-in unit inserted into the sub-rack.
Figure 4:
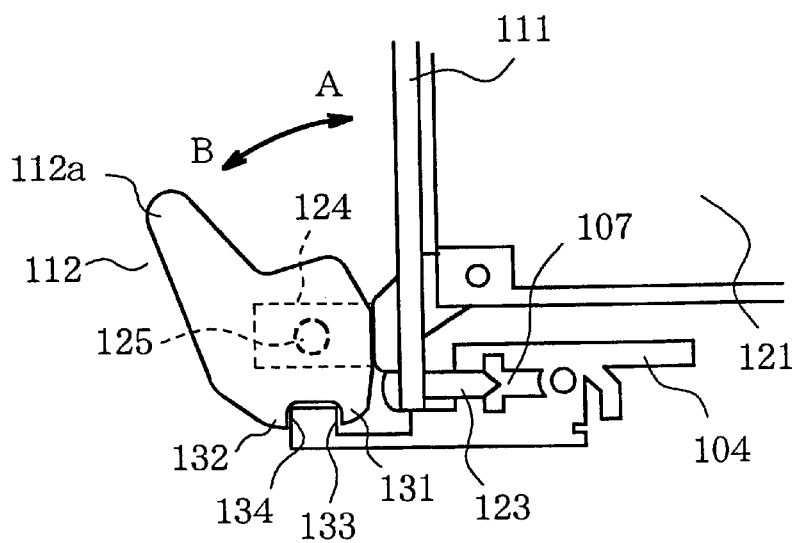
FIG. 4 is a side view of a conventional insertion and removal system in a plug-in unit for inserting the plug-in unit into the sub-rack and removing the plug-in unit from the sub-rack.
Figure 5:
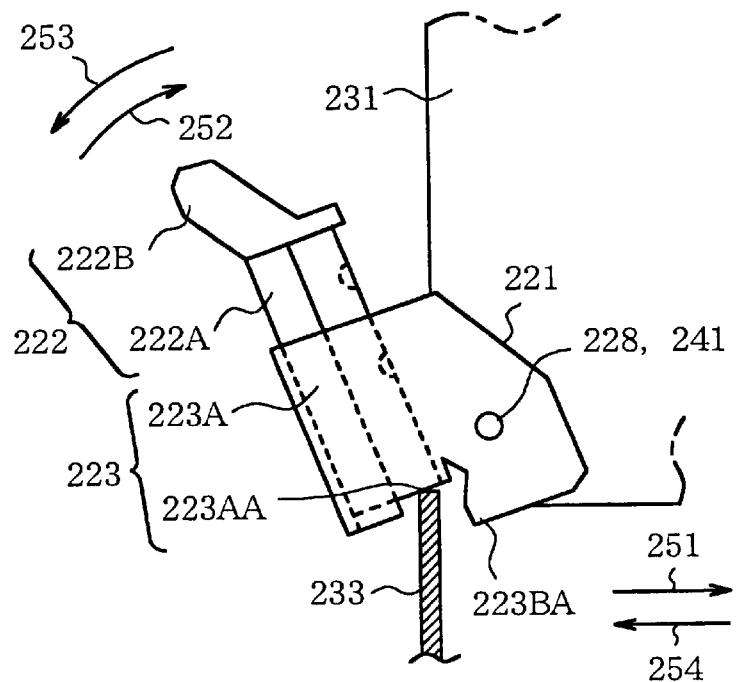
FIG. 5 is a side view of the constitution of a conventional insertion and removal system in a plug-in unit as disclosed in JP-A-2000/91770.
Figure 6:
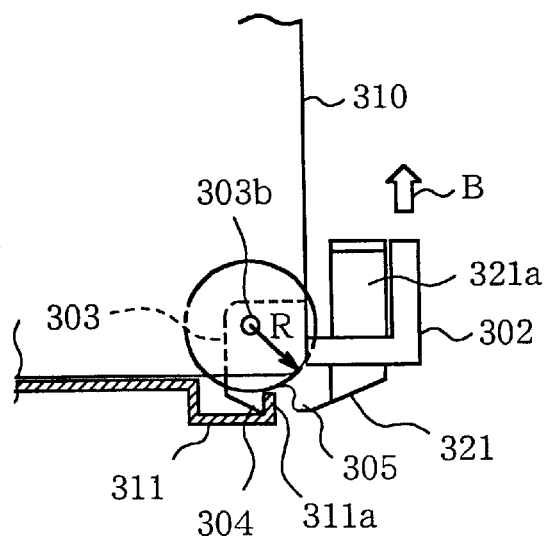
FIG. 6 is a side view of a conventional insertion and removal system in a plug-in unit as disclosed in JP-U-6/21273.
Figure 7A:
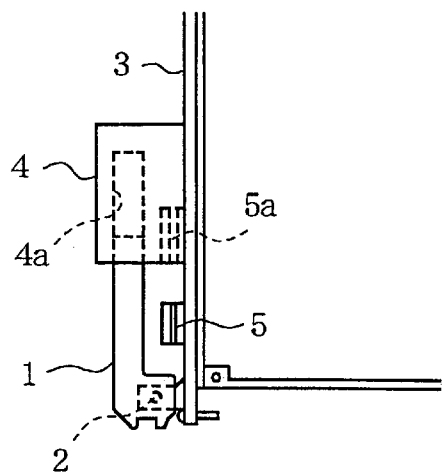
FIGS. 7A, 7B and 7C are drawings of an insertion and removal system in a plug-in unit in embodiment 1 according to the present invention, respectively.
Figure 7B:
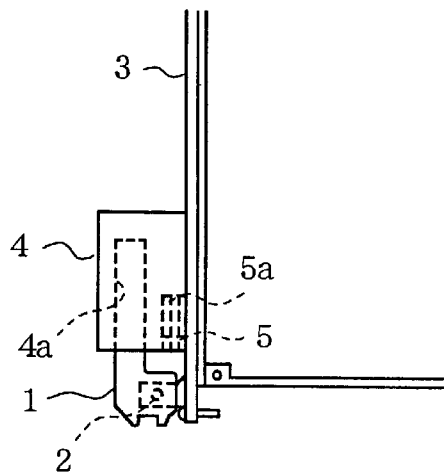
Figure 7C:
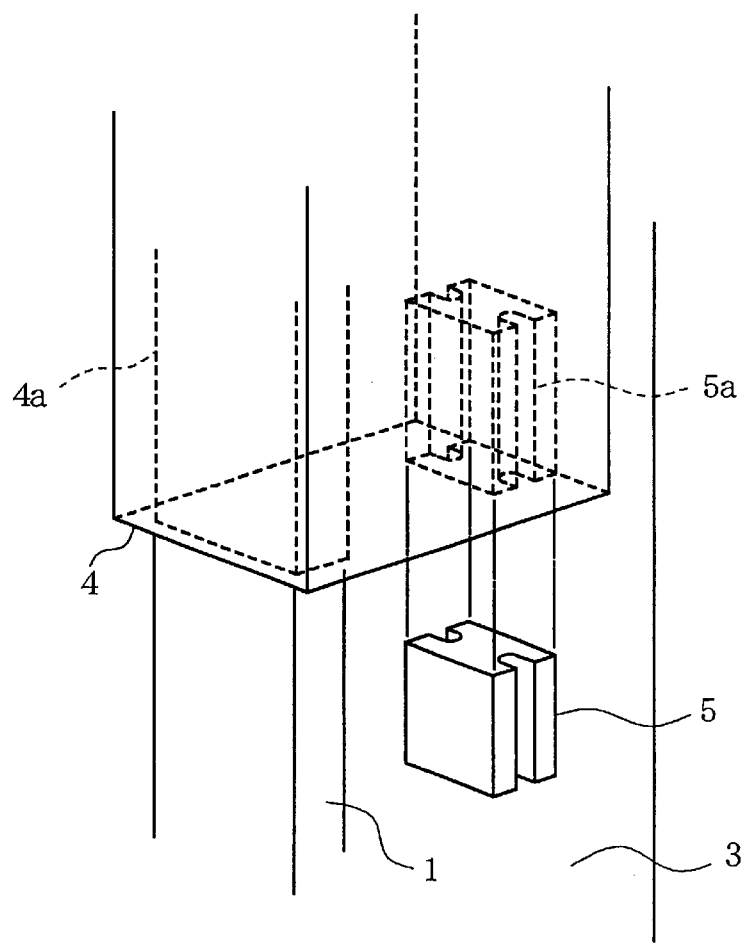

FIGS. 7A, 7B and 7C are drawings of the constitution of an insertion and removal system in a plug-in unit in embodiment 1 according to the present invention, respectively. FIG. 7A is a side view of a handle on extension. FIG. 7B is a side view of a handle on shrinkage. FIG. 7C is a perspective view of a lock system of the handle for locking a front panel. In the drawings, 1 denotes a lever (i.e. a lever part and a handle element) rotationally supported on an end of the front panel and rotationally operated in a direction of insertion or removal of the plug-in unit with respect to the sub-rack. Reference number 2 denotes a handle-support part of rotationally supporting the lever, which is arranged on an end of a front panel 3. Reference number 3 denotes the front panel arranged on a printed circuit board constituting a plug-in unit, for covering an opening of the sub-rack when the plug-in unit is housed in the sub-rack. Reference number 4 denotes a handle slider (a handle-extension slide element). The handle slider 4 is inserted freely into the lever 1 in an advanced or retreated (retracted) direction. The handle slider 4 is slid in a longitudinal direction of the lever 1 between an extension position of the lever 1 on extending the lever 1 at the maximum and a shrinkage position of the lever 1 whose length nearly corresponds to the length of the lever 1. Reference number 4a denotes an insertion hole allowing insertion of the lever 1 arranged on the handle slider 4 while 5 denotes a mating projection (a locking element) arranged on the front panel 3, and 5a denotes a mating pit (a locking element) of mating with the mating projection 5 arranged on the handle slider 4. A handle is constituted by the lever 1, the handle-support part 2 and an engagement claw, and is used for inserting the plug-in unit into the sub-rack and removing the plug-in unit from the sub-rack.

Figure 8:
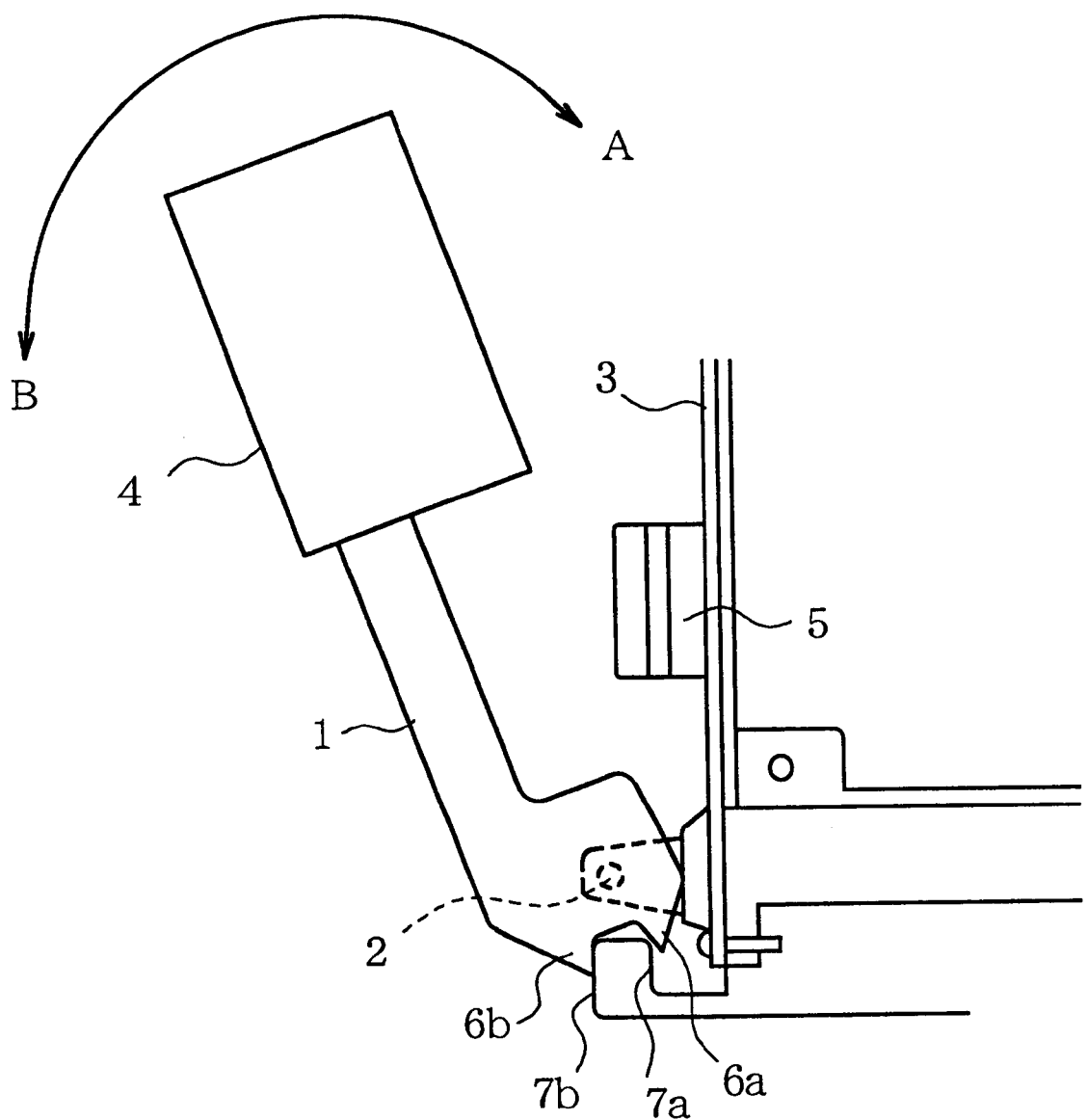
FIG. 8 is a side view of the operation of insertion and removal system in embodiment 1.

FIG. 8 is a side view of the operation of insertion and removal system in embodiment 1. In FIG. 8, 6a denotes a first engagement claw (an engagement part, a handle element) of the handle, and 6b denotes a second engagement claw (an engagement part, a handle element) of the handle. Reference number 7a denotes a first engagement part (a projection) formed in a front rail arranged on a front side of a top part and a bottom part constituting a sub-rack while 7b denotes a second engagement part (a projection) formed in the front rail. In FIG. 8, since the common numerals denote common elements in FIGS. 7A, 7B and 7C, the description of such parts is omitted.

Operation of the system in embodiment 1 will be described as follows:

When the plug-in unit is inserted into the sub-rack, the handle slider 4 is slid to the extension position of the lever 1 on extending the lever at the maximum as shown in FIG. 7A. As a result, the lever 1 can be substantially increased in length. Here, an inner diameter of the insertion hole 4a of the handle slider 4 is approximately equal to an outer diameter of the lever 1 to prevent the lever 1 from accidentally removing out of the insertion hole 4a. An engagement system may be arranged on an end of the lever 1 and a back of the insertion hole 4a.

Next, the printed circuit board 121 is slid along a groove formed on the guide rail 106. The guide pin 123, arranged on the plug-in unit 120, is then inserted into the locating hole 107 formed in the front rail 104 to locate the front panel 3 with respect to the front rail 104. The lever 1 of the handle is then rotated about the handle-support part 2 in the direction of arrow A shown in FIG. 8 in a state of engaging the first engagement claw 6a of the handle 112 with the first engagement part 7a of the front rail 104. The rotational force of the first engagement claw 6a, as a force in the insertion direction, is transferred to the first engagement part 7a to connect the connector 122 of the printed circuit board 121 to the back plane, and accordingly the insertion of the plug-in unit is finished. Here, the length of the lever 1 in the longitudinal direction becomes substantially longer by virtue of the handle slider 4. The force in the insertion direction, transferred to the first engagement part 7a, is enhanced by the action of a lever.

After the insertion of the plug-in unit is finished, the handle slider 4 is slid to the shrinkage or retracted position of the lever 1 whose length nearly corresponds to the length of the lever 1. Here, as shown in FIG. 7B, the mating projection 5, arranged on the front panel 3, is mated with the mating pit or recess 5a arranged in the handle slider 4, and accordingly they are locked. As a result, the lever 1 of the handle cannot be rotated in a state of placing the plug-in unit within the sub-rack to prevent the plug-in unit from accidental removal out of the sub-rack.

When the plug-in unit is removed from the sub-rack, the handle slider 4 is slid to the extension position of the lever 1 again. The lever 1 of the handle is then rotated about the handle-support part 2 in the direction of arrow B in a state of engaging the second engagement claw 6b of the handle with the second engagement part 7b of the front rail. The rotational force of the second engagement claw 6b, as a force in a removal direction, is transferred to the second engagement part 7b to remove the connector 122 of the printed circuit board 121 from the back plane. Next, the printed circuit board 121 is pulled along the groove formed on the guide rail 106 to remove the plug-in unit from the sub-rack. Here, the length of the lever 1 in the longitudinal direction becomes substantially longer by virtue of the handle slider 4. The force in the insertion direction, transferred to the second engagement part 7b, is enhanced by the action of a lever.

As described above, with such an arrangement in embodiment 1, the length of the lever 1 can be substantially changed to provide a sufficient force of the insertion and removal according to the plug-in unit with the need of the insertion and removal force. Since the lever 1 can be decreased in length after placing the plug-in unit in the sub-rack, the area mounted on the front panel 3 is not narrowed. The handle is locked on the front panel 3 to prevent the plug-in unit from accidental removal out of the sub-rack. Since the rotation of the handle slider 4 is limited to a small area on the front panel 3, the insertion and removal system on the periphery of the opening of the sub-rack can be scaled down in size. The handle slider 4 is supported on the front panel 3 by two points, or the locking system of the handle slider 4 on the front panel 3 and the handle-support part 2. Accordingly, the durability for withstanding an external force can be increased as compared with the conventional insertion and removal system in the plug-in unit. A high-performance insertion and removal system in the plug-in unit can be provided at a low cost without requiring high-accuracy for manufacturing the plug-in unit.

With embodiment 1, the locking element includes the mating pit 5a arranged in the handle slider 4 and the mating projection 5 arranged on the front panel 3 for mating with the mating pit 5a. The handle slider 4 can be locked by mating the mating pit 5a with the mating projection 5 on sliding to the shrinkage position to provide a locking system having a simple constitution, using a slight area on the front panel 3.

The handle slider 4 in embodiment 1 is a rectangular solid as shown in FIGS. 7A, 7B and 7C. However, the handle slider 4 of the present invention is not limited to such a shape.

Figure 9:
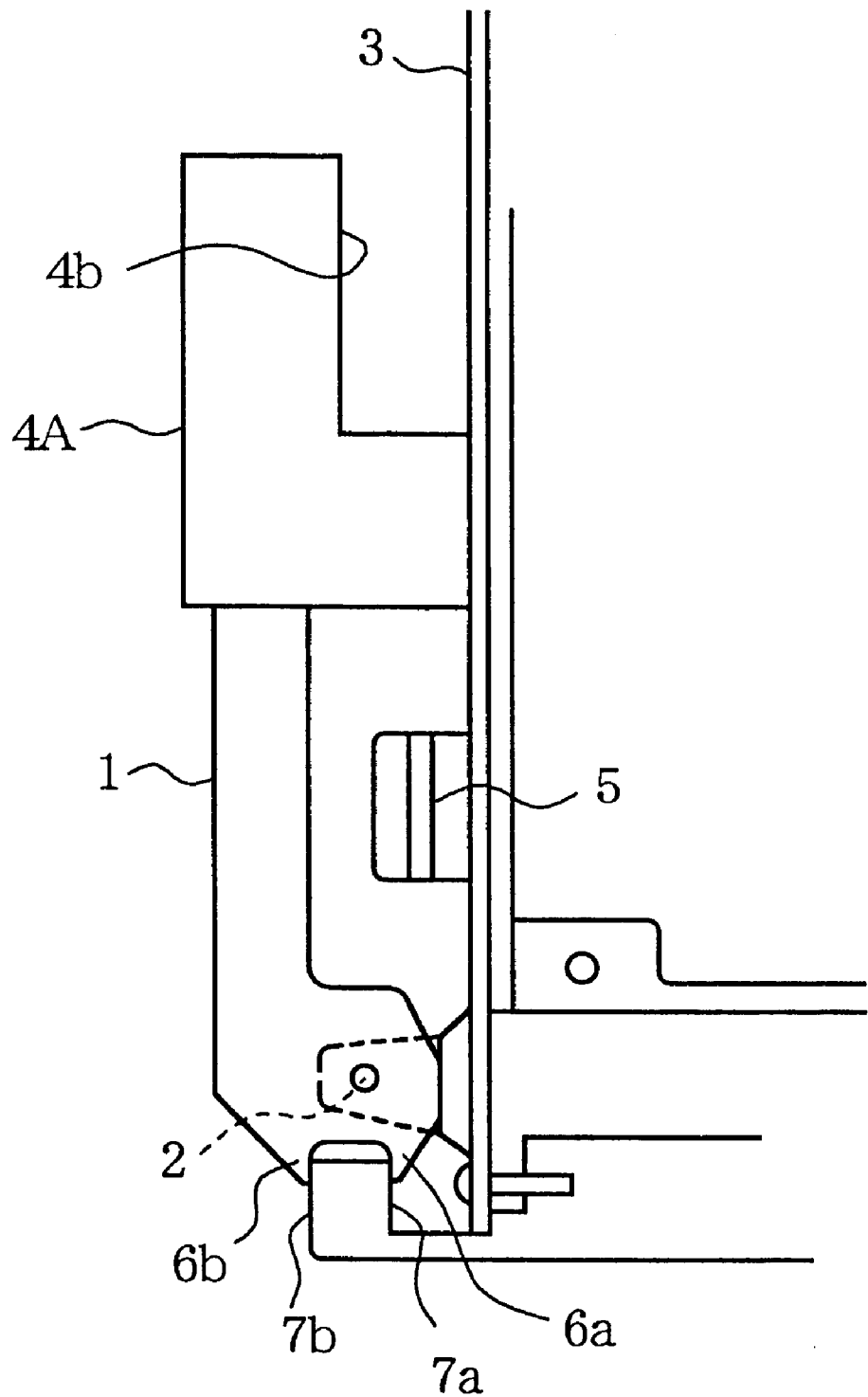
FIG. 9 is a side view of an insertion and removal system in a plug-in unit in alternative embodiment 1.

FIG. 9 is a side view of an insertion and removal system in a plug-in unit in alternative embodiment 1. In FIG. 9, 4A denotes a handle slider (a handle extension slide part) having a recess 4b arranged on the side of the front panel 3. Reference number 4b denotes a recess formed in a region on side of the front panel 3, except for the mating pit or recess Sa of the handle slider 4A. In FIG. 9, since common numerals denote common elements in FIGS. 7A, 7B, 7C and 8, the description of such parts is omitted.

Since the region on the side of the front panel 3 except for the mating pit 5a of the handle slider 4A, the area mounted on the front panel 3 can be enlarged, as compared with the handle slider 4.

Embodiment 2

With embodiment 2, a detector is provided, the detector detecting an insertion or removal state of the plug-in unit with respect to the sub-rack, with linking to a locking motion and an unlocking motion of a locking element with respect to a handle-extension slide element or a lever element.

Figure 10A:
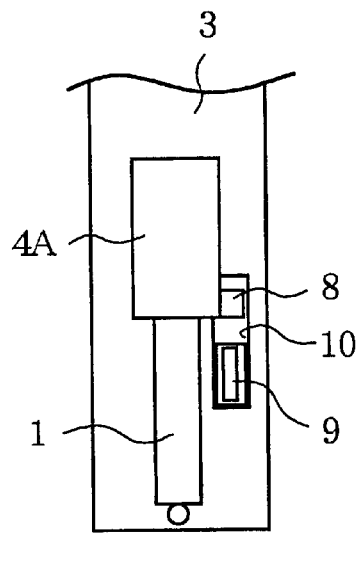
FIGS. 10A, 10B, 10C and 10D are drawings of an insertion and removal system in a plug-in unit in embodiment 2 according to the present invention, respectively.
Figure 10B:
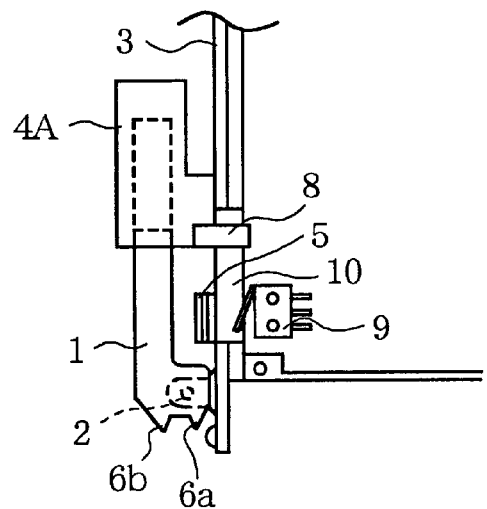
Figure 10C:
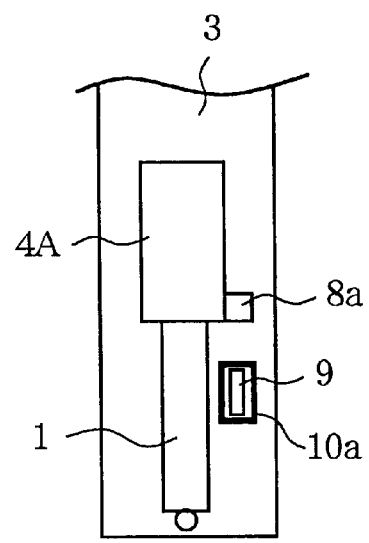
Figure 10D:
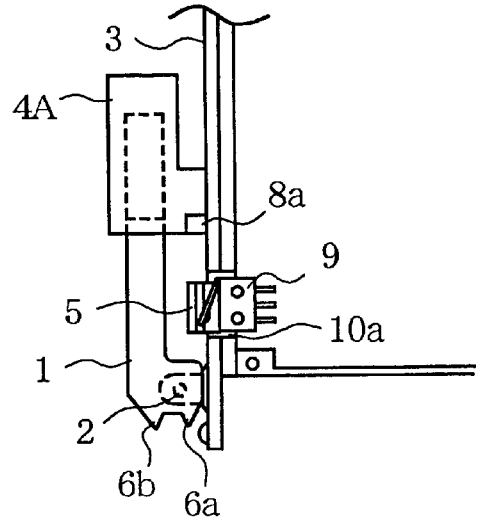

FIGS. 10A, 10B, 10C and 10D are drawings of the constitution of an insertion and removal system in a plug-in unit in embodiment 2 according to the present invention, respectively. Specifically, FIG. 10A is a front view of one example of the detector, and FIG. 10B is a side view of FIG. 10A. FIG. 10C is a front view of another examples of the detector, and FIG. 10D is a side view of FIG. 10C. In the drawings, 8 and 8a denote triggers arranged on the handle slider 4A, the respective triggers constituting detectors. When the handle slider 4A is slid to the shrinkage position of the lever 1, a micro-switch 9 turns on. When the handle slider 4A is slid from the shrinkage position to the extension position, the micro-switch 9 turns off. The micro-switch 9 constituting the detector is arranged in holes 10 or 10a arranged in the front panel 3 to detect insertion and removal of the plug-in unit with respect to the sub-rack. Size of the hole 10 or 10a constituting the detector depends on position of the micro-switch 9. In FIGS. 10A, 10B, 10C and 10D, since the common numerals denote common elements in FIGS. 7A to 9, the description of such parts is omitted.

Operation of the system in embodiment 2 will be described as follows:

At first, after insertion of the plug-in unit into the sub-rack, the handle slider 4A is slid to the shrinkage position. When the handle slider 4A reaches the shrinkage position, the trigger 8 or 8a arranged on the handle slider 4A turns on the micro-switch 9 arranged in the hole 10 or 10a arranged in the front panel 3. As a result, a signal informing the operator of finishing of insertion of the plug-in unit with respect to the sub-rack, acting as an interrupt signal designating service conditions of the plug-in unit, is transferred to another plug-in units through electronic circuits arranged in the plug-in unit or through sub-racks. The handle is completely locked on the front panel 3. Accordingly, the plug-in unit can be operated to prevent the plug-in unit from accidental removal out of the sub-rack as compared with the constitution of embodiment 1.

Next, when the plug-in unit is removed from the sub-rack, the handle slider 4A is slid to the extension position of the lever 1 again. The trigger 8 or 8a is disconnected to turn off the micro-switch 9. As a result, the interrupt signal designating service conditions of the required plug-in unit, transferred to the electronic circuit in the plug-in unit, is completely stopped. It is possible to inform another plug-in units through the sub-rack that the required plug-in unit transits to unserviceable conditions. Accordingly, by only sliding the handle slider 4A in the extension direction on operating the plug-in unit, it is possible to inform another apparatus through the sub-rack that the required plug-in unit transits to unserviceable conditions and to facilitate removal motion of the plug-in unit from the sub-rack.

When the micro-switch 9 is arranged in the back of the hole 10 as shown in FIGS. 10A and 10B, the trigger 8, turning on and off the micro-switch 9, is increased in size by depth of the hole 10. Accordingly, the opening of the hole 10 for allowing slide of the trigger 8 is increased on a proportional basis. On the other hand, when the micro-switch 9 is arranged at a position substantially parallel to the front panel 3 as shown in FIGS. 10C and 10D, the hole 10a having a small opening the extent to which an only on-off lever part of the micro-switch 9 is exposed. A small-size trigger 8a may be used corresponding with the size of the hole 10a above.

As described above, the detector is constituted by the trigger 8 or 8a and the micro-switch 9, and detects an insertion or removal state of the plug-in unit with respect to the sub-rack, with linking to a locking motion and an unlocking motion of the handle slider 4A. The handle is completely locked on the front panel 3. Accordingly, the plug-in unit can be operated to prevent the plug-in unit from accidental removal out of the sub-rack as compared with the constitution of embodiment 1. Accordingly, by only sliding the handle slider 4A in the extension direction on operating the plug-in unit, it is possible to inform another apparatus through the sub-rack that the required plug-in unit transits to unserviceable conditions and to facilitate removal motion of the plug-in unit from the sub-rack.

Embodiment 3

The system in embodiment 3 includes a handle-extension slide element inserted freely into the lever part in an advance or retreat direction to be slid in a longitudinal direction of the lever between an extension position of the lever on extending the lever at the maximum and a shrinkage position of the lever part whose length nearly corresponds to the length of the lever part; and a locking element including an engagement pit arranged in the lever part and an engagement projection arranged on the front panel, the engagement projection for engaging with the engagement pit when the lever part is rotated toward the front panel side, for locking the lever part on the front panel by transferring a stress generated in the lever part to the engagement pit as a force narrowing an opening diameter of the engagement pit to lock the lever part on the front panel.

Figure 11A:
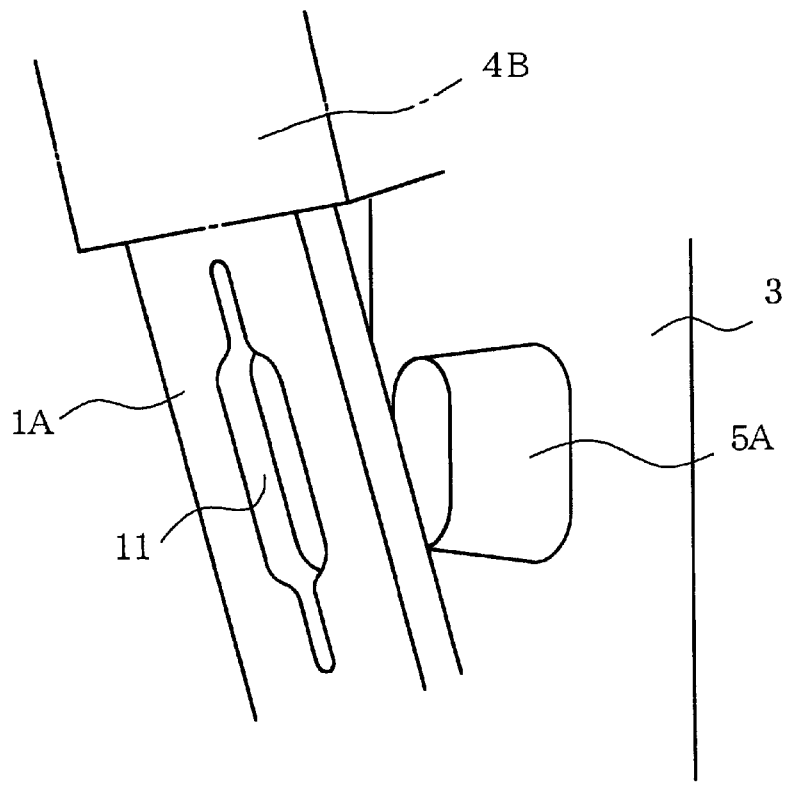
FIGS. 11A and 11B are drawings of an insertion and removal system in a plug-in unit in embodiment 3 according to the present invention, respectively.
Figure 11B:
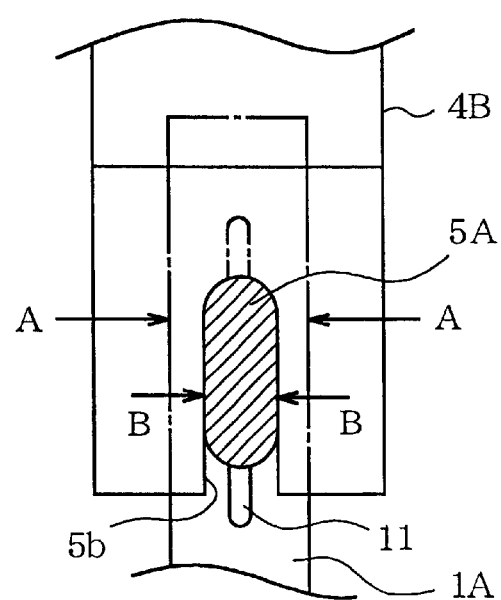

FIGS. 11A and 11B are drawings of the constitution of an insertion and removal system in a plug-in unit in embodiment 3 according to the present invention, respectively. Specifically, FIG. 11A is a perspective view of a locking system of a lever part with respect to a front panel. FIG. 11B is a front view of the principle of the locking system as shown in FIG. 11A. In FIG. 11B, the lever part, locked by the handle slider on the side of the front panel, can be seen from the side of the front panel when the front panel is optically transparent. In the drawings, 1A denotes a lever (a lever part, a handle element) being rotationally supported on the front panel 3, and being operated in the insertion and removal directions of the plug-in unit with respect to the sub-rack. The lever 1A has a mating pit or recess 11 allowing mating with a mating projection 5A arranged on the front panel 3. The lever 1A is formed so as to have an outer diameter approximately equal to an inner diameter of an insertion hole (not shown) allowing insertion of the lever 1A of the handle slider 4B. A stress generated on the lever 1A, when the handle slider 4B is slid to a shrinkage position of the lever 1A, can be transferred to the mating pit 11 as a force narrowing the opening diameter of the mating pit 11. An engagement system may be provided at the end of the lever 1A and the back of the insertion hole, and a taper may be formed at the lever 1A in a longitudinal direction of the lever 1A. Any constitution allowing transfer of the stress generated on the lever 1A as the force narrowing the opening diameter of the mating pit 11 may be used. The lever 1A is made of flexible resin materials.

Reference number 4B denotes a handle slider (a handle extension slide part, a handle element). The handle slider 4B is inserted freely into the lever 1A in an advance or retreat direction, and is slid in a longitudinal direction of the lever 1A between an extension position of the lever 1A on extending the lever 1A at the maximum and a shrinkage position of the lever 1A whose length nearly corresponds to the length of the lever 1A. The handle slider 4B has a notch portion 5b formed on the side of the front panel 3 so as to interpose an engagement projection (a locking element) 5A arranged on the front panel 3. The engagement projection 5A may have a taper in a direction of the normal of the front panel 3 so as to facilitate engagement with an engagement pit or recess 11 arranged in the lever 1A. The notch portion 5b is arranged in the handle slider 4B. The notch portion 5b may be gradually decreased in size in the longitudinal direction so as to be gradually smaller than an outer diameter of the engagement projection 5A. As a result, the handle can be securely locked on the front panel 3 when the handle slider 4B is slid to the shrinkage position of the lever 1A. The engagement pit (a locking element) 11 engages with the engagement projection 5A when the lever 1A is rotationally moved toward the side of the front panel 3. In FIGS. 11A and 11B, since the common numerals denote common elements in FIGS. 7A to 10D, the description of such parts is omitted.

Operation of the system in embodiment 3 will be described as follows:

At first, when the lever 1A is rotationally moved toward the side of the front panel 3, the engagement projection 5A arranged on the front panel 3 engages with the engagement pit 11 arranged in the lever 1A. The handle slider 4B is slid to the shrinkage position of the lever 1A. When the handle slider 4B reaches the shrinkage position of the lever 1A, a stress generated on the lever 1A, as a force narrowing the opening diameter of the engagement pit 11 as shown in arrow A of FIG. 11B, transfers to the engagement pit 11. A force of arrow B is transferred to the engagement projection 5A so as to interpose the engagement projection 5A in the notch portion 5b of the handle slider 4B. Accordingly, the handle, including the lever 1A and the handle slider 4B, is locked on the side of the front panel 3.

Figure 12:
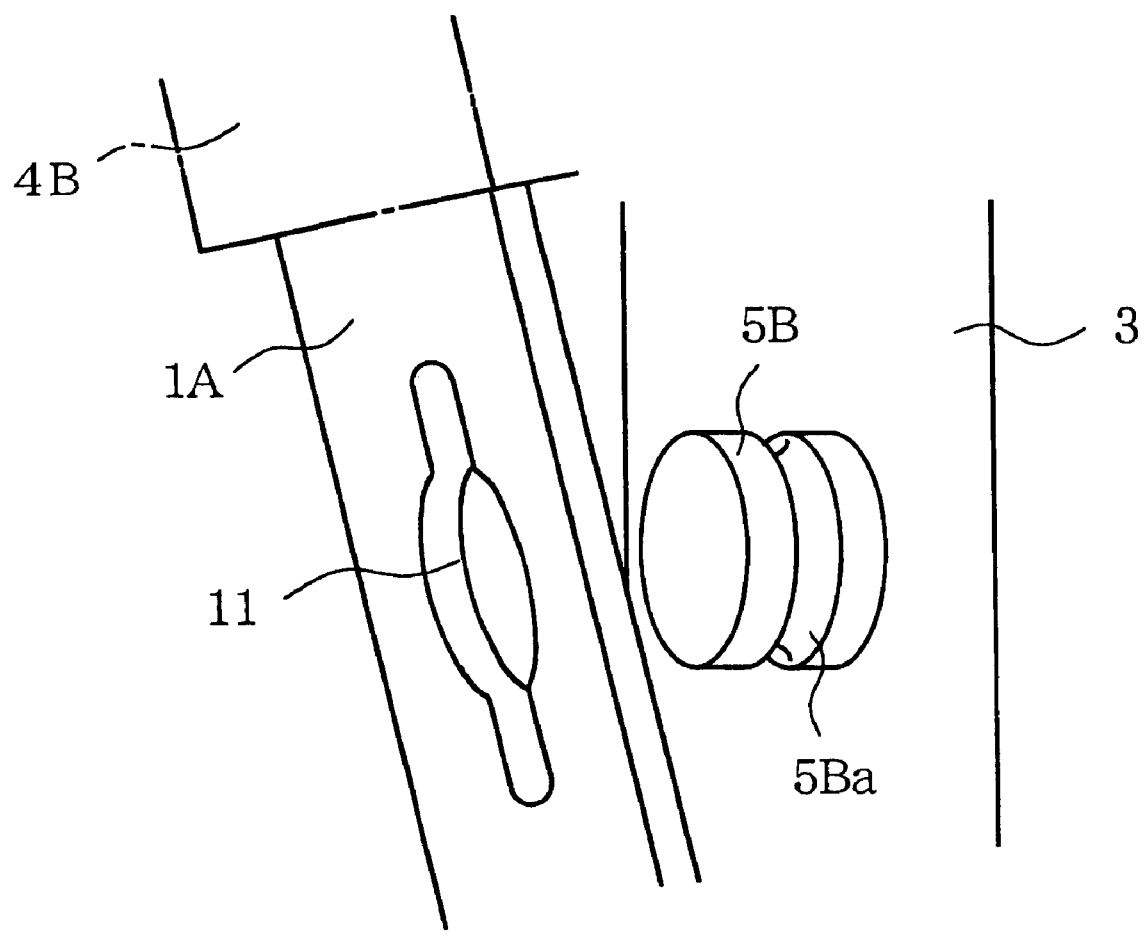
FIG. 12 is a perspective view of an insertion and removal system in a plug-in unit in alternative embodiment 3.

Hereafter, alternative embodiment 3 will be described as follows:

FIG. 12 is a perspective view of an insertion and removal system in a plug-in unit in alternative embodiment 3. In FIG. 12, 5B denotes an engagement projection (a locking element) arranged on the front panel 3. 5Ba denotes a pit (a detector) arranged on an outer periphery of the engagement projection 5B. In FIG. 12, since the common numerals denote common elements in FIGS. 7A to 11B, the description of such parts is omitted.

Next, the summary of alternative embodiment 3 will be described.

When the engagement projection 5B is inserted into the engagement pit 11 of the lever 1A, the engagement pit 11 reaches the pit 5Ba arranged on the outer periphery of the engagement projection 5B to fit an inner wall of the opening the engagement pit 11 in the pit 5Ba. Here, the engagement pit 11 fit in the pit 5Ba is released from the stress of enlarging the opening of the engagement pit 11. Accordingly, the stress is dispersed into the lever 1A through the inner wall of the opening of the engagement pit 11. Vibration generated on the lever 1A is transferred to an operator, and the operator can feel that the engagement projection 5B is normally inserted into the engagement pit 11.

Although the pit 5Ba is arranged in the outer periphery of the engagement projection 5B, alternatively a projection may be arranged on the outer periphery of the engagement projection 5B. Here, when the engagement projection 5B is inserted into the engagement pit 11 of the lever 1A or when the engagement projection 5B is removed from the engagement pit 11, the inner wall of the opening of the engagement pit 11 goes beyond the projection above. In this time, the operator may feel that the engagement projection 5B is normally inserted into the engagement pit 11, on the basis of the vibration above.

As described above, the system in embodiment 3 can obtain the same effect as the system in embodiment 1. The locking system in embodiment can have a simple constitution as compared with the constitution of embodiment 1 to lock the handle on the side of the front panel 3.

According to embodiment 3, the pit 5Ba, acting as a detector detecting finish of engagement operation with the engagement pit 11, is arranged in the outer periphery of the engagement projection 5B. Accordingly, since the operator can feel that the lever 1A is normally locked on the side of the front panel 3 or is normally unlocked from the side of the front panel 3. The reliability of locking operation can be enhanced.

The constitution of embodiment 2 may expand its applicability to embodiment 3. The system of embodiment 3 can therefore obtain the same effect as embodiment 2.

Embodiment 4

The system in embodiment 4 includes a handle-extension rotation element rotationally supported on the lever part to rotationally move in a longitudinal direction of the lever part between an extension position of the lever part on extending the lever part at the maximum and a refractive position of the lever part whose length nearly corresponds to the length of the lever part; and a locking element arranged on the handle-extension rotation element and the front panel, the locking element for locking the handle-extension rotation element, rotationally moved to the refractive position, on the front panel.

Figure 13A:
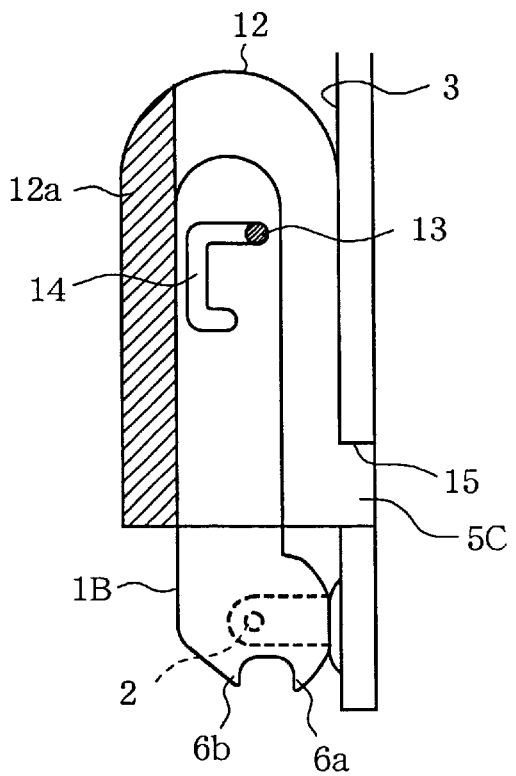
FIGS. 13A, 13B and 13C are drawings of the constitution of an insertion and removal system in a plug-in unit in embodiment 4 according to the present invention, respectively.
Figure 13B:
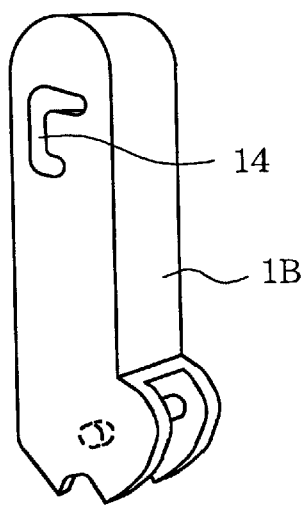
Figure 13C:
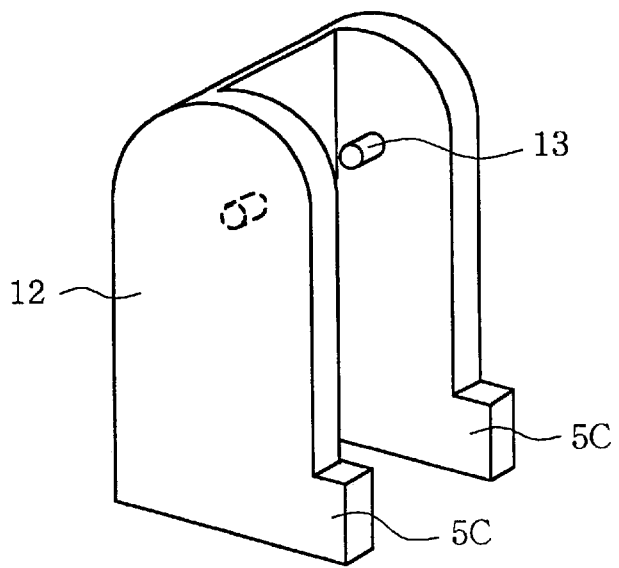

FIGS. 13A, 13B and 13C are drawings of the constitution of an insertion and removal system in a plug-in unit in embodiment 4 according to the present invention, respectively. Specifically, FIG. 13A is a side view of such constitution, FIG. 13B is a perspective view of the lever part, and FIG. 13C is a perspective view of the handle extension rotation element. In the drawings, 1B denotes a lever (a lever part) rotationally supported on an end of the front panel 3 to be rotationally operated in the insertion and removal direction of the plug-in unit with respect the sub-rack. The lever 1B has a bearing groove 14 rotationally supporting a rotational part 12 (a handle extension rotation element). Reference number 5C denotes a mating projection (a locking element) formed on the rotational part 12. The mating projection 5C is mated with a mating pit or recess 15 (a locking element) formed in the front panel 3, when the rotational part 12 is rotationally moved toward the refractive position, to lock the rotational part 12 on the side of the front panel 3. The rotational part 12 can be rotationally moved about a rotational axis 13, which is rotationally supported in the bearing groove 14 of the lever 1B, between the extension position of the lever 1B on extending the lever 1B at the maximum and the refractive position of the lever 1B whose length nearly corresponds to the length of the lever 1B. Reference number 12a denotes a wall (a handle extension rotation element) of the rotational part 12. The wall 12a stops rotation of both the rotational part 12 and the lever 1B when the rotational axis (a handle extension rotation element) 13 is moved in the bearing groove 14 toward the side of the handle-support part 2 of the lever 1B at the extending position.

The rotational axis 13 is arranged at a side wall of the rotational part 12, and is rotationally supported in the bearing groove 14 of the lever 1B. The bearing groove 14 includes two different-length grooves, which are communicated to each other, and which cross each other at right angles. One of the grooves is formed at the lever 1B near the handle-support part 2, and is shorter in length than the other. The mating pit 15 is mated with the mating projection 5C of the rotational part 12, and has an inner diameter nearly equal to an outer diameter of the mating projection 5C so as to reliably mate with the mating projection 5C. In FIGS. 13A, 13B and 13C, since the common numerals denote common elements in FIGS. 7A to 12, the description of such parts is omitted.

Operation of the system in embodiment 4 will be described as follows:

FIGS. 14A, 14B, 14C and 14D are side views of explaining operation of extension of the handle element of an insertion and removal system in a plug-in unit in embodiment 4 according to the present invention.

At first, the mating projection 5C is mated with the mating pit 15 of the front panel 3 to lock the rotational part 12 at the refractive position. (see FIG. 14A)

Next, the rotational part 12 is moved to an opposite direction (a left hand of FIG. 14B) to the front panel 3 in order to unlock mate of the mating projection 5C of the rotational part 12 with the mating pit 15 of the front panel 3. Here, the rotational axis 13 moves in an upper groove of the bearing groove 14 to reach an inlet of a communication groove for communicating two different-length grooves each other.

Figures 14A, 14B, 14C, 14D:
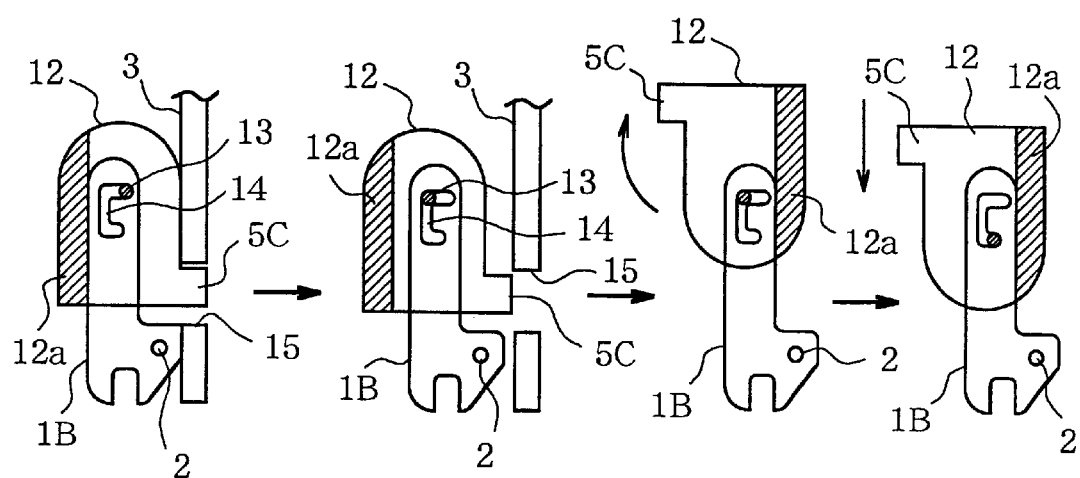
FIGS. 14A, 14B, 14C and 14D are side views of explaining operation of extension of the handle element of an insertion and removal system in a plug-in unit in embodiment 4 according to the present invention.

Here, the rotational part 12 is rotated about the rotational axis 13 in a direction of arrow of FIG. 14C to substantially extend the lever 1B in length. The rotational axis 13 moves in the communication groove toward a lower groove of the bearing groove 14, and further moves toward the back of the lower groove. (see FIG. 14D) In embodiment 4, the extension position of the lever 1B is defined as the state of reaching the rotational axis 13 to the back of the lower groove of the bearing groove 14. In this extension position, the rotational part 12 moves from the inlet of the communication groove for communicating two grooves of the bearing groove 14 allowing free rotation of the rotational part 12 about the rotational axis 13 to the lever 1B near the handle-support part 2. Accordingly, when a rotational force is exerted on the rotational part 12, the wall 12a comes into contact with the lever 1B to lock rotation of the rotational part 12. Thus, the rotational part 12 keeps the extension position of the lever 1B.

Figures 15A, 15B, 15C:
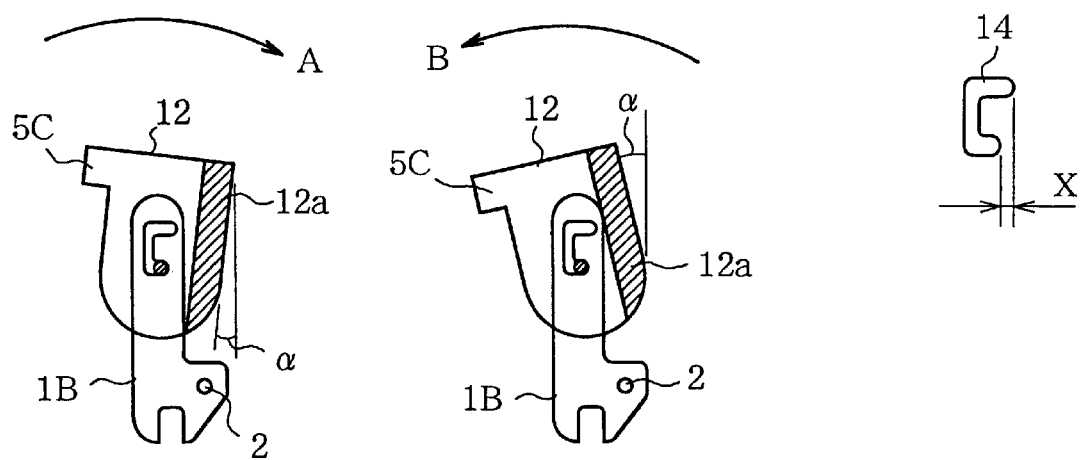
FIGS. 15A, 15B and 15C are side views of explaining a keeping system keeping an extension position of the handle element of an insertion and removal system in a plug-in unit in embodiment 4 according to the present invention.

FIGS. 15A, 15B and 15C are side views of explaining a keeping system keeping an extension position of the handle element of an insertion and removal system in a plug-in unit in embodiment 4 according to the present invention. As shown in FIGS. 15A and 15B, when the rotational axis 13 moves in the back of the lower groove of the bearing groove 14 to perform rotational operation about the handle-support part 2, the rotational part 12 has the inclination α of the longitudinal direction of the lever 1B. In embodiment 4, the smaller inclination α of the longitudinal direction of the lever 1B, the higher operability of insertion and removal of the plug-in unit with respect to the sub-rack. Therefore, as shown in FIG. 15C, since a difference x between length of the two grooves of the bearing groove 14 is appropriately ensured, a contact area between the wall 12a and the lever 1B can be ensured at the extension position. As a result, such can prevent the rotational part 12 from rotation about the rotational axis 13. Alternatively, the contact area between the wall 12a and the lever 1B can be ensured at the extension position by ensuring length of the communication groove communicating two grooves of the bearing groove 14.

As described above, with such an arrangement in embodiment 4, the length of the lever 1B can be substantially changed to provide a sufficient force of the insertion and removal according to the plug-in unit with the need of the insertion and removal force. Since the lever 1B can be decreased in length after placing the plug-in unit in the sub-rack, the area mounted on the front panel 3 is not narrowed. The handle is locked on the front panel 3 to prevent the plug-in unit from accidental removal out of the sub-rack. Since the rotation of the rotational part 12 at the refractive position of the lever 1B is locked on a small area arranged on the front panel 3, the insertion and removal system on the periphery of the opening of the sub-rack can be scaled down in size. The rotational part 12 is supported on the front panel 3 by two points, or the locking system of the rotational part 12 on the front panel 3 and the rotational fulcrum of the lever 1B. Accordingly, the durability to withstand an external force can be increased as compared with the conventional insertion and removal system in the plug-in unit.

With embodiment 4, when the rotational part 12 is rotationally moved to the refractive position, the mating projection 5C is mated with the mating pit 15. Accordingly, the locking system having a simple constitution can be provided to lock the handle on the front panel 3.

The rotational part 12 in embodiment 4 is provided to cover the lever 1B with the two side walls. However, the rotational part of the present invention is not limited to such constitution.

Figure 16A:
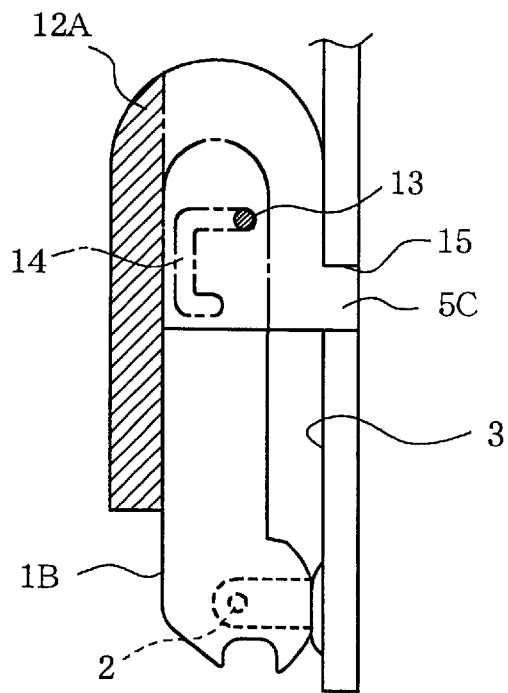
FIGS. 16A and 16B are drawings of an insertion and removal system in a plug-in unit in alternative embodiment 4.
Figure 16B:
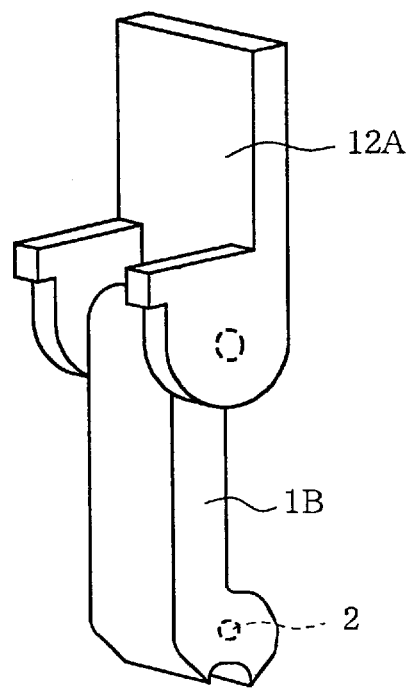

FIGS. 16A and 16B are drawings of an insertion and removal system in a plug-in unit in alternative embodiment 4. Specifically, FIG. 16A is a side view of the system, and FIG. 16B is a perspective view of the handle extension rotation element rotated to the extension position. In the drawings, 12A denotes a rotational part (a handle extension rotation element), which does not have a side wall except for the rotational axis 13, and which becomes a flat plate in a state of rotationally moving the rotational part 12A to the extension position. In FIGS. 16A and 16B, since the common numerals denote common elements in FIGS. 7A to 15C, the description of such parts is omitted.

As shown in FIG. 16A, the rotational part 12 includes an axial part, which is rotationally supported on the lever 1B, and a plate extending from the axial part. On rotating the rotational part 12A, the lever 1B at the extension position is parallel to the plate of the rotational part 12A. As a result, the handle can be scaled down in size as compared with embodiments above.

The constitution of embodiment 2 may expand its applicability to embodiment 4. For example, the micro-switch 9 may be arranged in the mating pit 15 to turn on/off by using the mating projection 5C of the rotational part 12 or 12A. As a result, the system of embodiment 4 can therefore obtain the same effect as embodiment 2.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An insertion and removal system in plug-in unit, comprising:
    a front panel arranged on a plug-in unit insertable into a sub-rack, the front panel covering an opening frame of the sub-rack when the plug-in unit is inserted into the sub-rack, said front panel having a projection positioned thereon;
    a handle element including
        a lever rotationally supported on an end of the front panel and rotationally operated in one of a direction of insertion and a direction of removal of the plug-in unit with respect to the sub-rack, and
        an engagement part for engaging with said projection positioned on the opening frame of the sub-rack for transferring a rotational force of the lever upon rotationally operating the lever towards the projection,
    a handle-extension slide element slidably mounted on the lever for being movable in a longitudinal direction of the lever between an extended position of the lever for extending the length of lever to a maximum and a retracted position for reducing the length of the lever; and
    a locking element positioned on the handle-extension slide element for engaging the projection on the front panel, the locking element locking the handle-extension slide element in position on the front panel in the retracted position of the lever.

2. An insertion and removal system in plug-in unit according to claim 1, wherein the locking element comprises a recess formed in the handle-extension slide element for mating with the projection on the front panel, and wherein the handle-extension slide element is locked by mating the projection with the recess when the handle-extension slide element is slid to the retracted position.

3. An insertion and removal system in plug-in unit according to claim 1, wherein the handle-extension slide element has a recess arranged in the front panel.

4. An insertion and removal system in plug-in unit according to claim 1, further comprising a detector for detecting at least one of an insertion state and a removal state of the plug-in unit with respect to the sub-rack, upon occurrence of a locking motion and an unlocking motion, respectively, of the locking element with respect to the handle-extension slide element or the lever element.

5. An insertion and removal system in plug-in unit, comprising:
    a front panel arranged on a plug-in unit insertable into a sub-rack, the front panel covering an opening frame of the sub-rack when the plug-in unit is inserted into the sub-rack, said opening frame having a projection positioned thereon;
    a handle element including
        a lever rotationally supported on an end of the front panel and rotationally operated in one of a direction of insertion and a direction of removal of the plug-in unit with respect to the sub-rack, and
        an engagement part for engaging with said projection positioned on the opening frame of the sub-rack for transferring a rotational force of the lever upon rotationally operating the lever towards the projection,
    a handle-extension slide element slidably mounted on the lever for being movable in a longitudinal direction of the lever between an extended position of the lever for extending the length of lever to a maximum and a retracted position for reducing the length of the lever; and
    a locking element including an engagement recess formed in the lever for engaging the projection arranged on the front panel, the projection engaging with the engagement recess when the lever part is rotated toward the front panel side, for locking the lever part on the front panel by transferring a stress generated in the lever part to the engagement recess as a force for narrowing an opening diameter of the engagement recess and for locking the lever on the front panel.

6. An insertion and removal system in plug-in unit according to claim 5, further comprising a detector positioned on an outer peripheral portion of the projection, the detector detecting completion of the engagement motion with respect to the engagement recess.

7. An insertion and removal system in plug-in unit according to claim 5, wherein the handle-extension slide element has a recess located in the front panel.

8. An insertion and removal system in plug-in unit according to claim 5, further comprising a detector for detecting at least one of an insertion state and a removal state of the plug-in unit with respect to the sub-rack, upon occurrence of a locking motion and an unlocking motion, respectively, of the locking element with respect to one of the handle-extension slide element and the lever part.

9. An insertion and removal system in plug-in unit, comprising:

a front panel arranged on a plug-in unit insertable into a sub-rack, the front panel covering an opening frame of the sub-rack when the plug-in unit is inserted into the sub-rack, said front panel having a projection positioned thereon;

a handle element including
    a lever rotationally supported on an end of the front panel and rotationally operated in one of a direction of insertion and a direction of removal of the plug-in unit with respect to the sub-rack, and
    an engagement part for engaging with said projection positioned on the opening frame of the sub-rack for transferring a rotational force of the lever upon rotationally operating the lever towards the projection, a handle-extension rotation element rotationally supported on the lever for rotationally moving in a longitudinal direction of the lever part between an extended position of the lever upon extending the lever to maximum length and a retracted position of the lever; and a locking element positioned on the handle-extension rotation element and the front panel, the locking element locking the handle-extension rotation element, upon being rotationally moved to the retracted position, on the front panel.

10. An insertion and removal in a plug-in unit according to claim 9, wherein the handle-extension rotation element comprises an axial part rotationally supported on the lever and a plate for connecting with the axial part, the handle-extension rotation element in the extension position having a planar shape.

11. An insertion and removal in a plug-in unit according to claim 9, wherein the locking element includes a projection which is arranged in the handle-extension rotation element, and a recess which is arranged in the front panel for mating with the projection, and wherein the handle-extension rotation element is locked by mating the projection with the recess when the handle-extension rotation element is rotationally moved to the retracted position.

12. An insertion and removal in a plug-in unit according to claim 11, wherein the handle-extension rotation element includes an axial part rotationally supported by the lever part and a plate for connecting with the axial part, the handle-extension rotation element in the extended position having a planar shape.

13. An insertion and removal system in plug-in unit according to claim 9, further comprising a detector for detecting at least one of an insertion state and a removal state of the plug-in unit with respect to the sub-rack, upon a locking motion and an unlocking motion, respectively, of the locking element with respect to the handle-extension rotation element.

* * * * *